(12) United States Patent
Oishi (10) Patent No.: US 7,081,652 B2
(45) Date of Patent: Jul. 25, 2006

(54) SEMICONDUCTOR DEVICE HAVING A SIDE WALL INSULATING FILM AND A MANUFACTURING METHOD THEREOF

(75) Inventor: Amane Oishi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/888,976

(22) Filed: Jul. 13, 2004

(65) Prior Publication Data
US 2005/0230749 A1  Oct. 20, 2005

(30) Foreign Application Priority Data
Apr. 14, 2004  (JP) .............................. 2004-119362

(51) Int. Cl.
*H01L 29/78* (2006.01)
(52) U.S. Cl. ............. 257/344; 257/347; 257/382; 257/413; 257/622; 257/900
(58) Field of Classification Search ................ 257/344, 257/347, 622, 900
See application file for complete search history.

(56) References Cited
U.S. PATENT DOCUMENTS 4,419,810 A * 12/1983 Riseman .................. 438/303
5,071,780 A * 12/1991 Tsai ........................ 438/303
5,319,232 A   6/1994 Pfiester
6,624,034 B1  9/2003 Abe et al.
6,677,646 B1 * 1/2004 Ieong et al. .............. 257/347

* cited by examiner

*Primary Examiner*—Gene M. Munson
(74) *Attorney, Agent, or Firm*—Oblon, Spivak, McClelland, Maier & Neustadt, P.C.

(57) ABSTRACT

A manufacturing method of a semiconductor device having a side wall insulating film, comprising; forming a gate insulating film on a semiconductor substrate, forming a gate electrode on the gate insulating film, forming a first side wall insulating film on a side surface of the gate electrode, forming a projecting portion on a first upper surface of the semiconductor substrate adjacent to the first side wall insulating film, forming a first diffusion layer by introducing impurities to the projecting portion formed on the semiconductor substrate, removing the first side wall insulating film so as to expose a second upper surface of the semiconductor substrate located below the first side wall insulating film, a width of the second upper surface exposed being a X, forming a second diffusion layer by introducing impurities to the second upper surface of the semiconductor substrate, and forming a second side wall insulating film on the side surface of the gate electrode and the second upper surface of the semiconductor substrate, a width of the second side wall insulating film being a Y, wherein the Y is 0.5X or more and the X or less ($0.5X \leq Y \leq X$).

14 Claims, 7 Drawing Sheets

SEMICONDUCTOR DEVICE HAVING A SIDE WALL INSULATING FILM AND A MANUFACTURING METHOD THEREOF

A semiconductor device having a side wall insulating film and a manufacturing method thereof.

CROSS-REFERENCE TO RELATED APPLICATION

This application is based upon and claims the benefit of priority from the prior Japanese Patent Application No. 2004-119362, filed Apr. 14, 2004, the entire contents of which are incorporated herein by reference.

BACKGROUND OF THE INVENTION

1. Field of the Invention

This present invention relates to a semiconductor device having a side wall insulating film and a manufacturing method thereof.

2. Description of the Related Art

Recently, as a semiconductor chip is downsized, it is getting more and more difficult to form a shallow extension portion and highly activate impurities injected into a gate electrode. In order to solve the trade-off problem of the forming the shallow extension portion and the highly activating impurities, a manufacturing method of forming the extension layer after forming diffusion layers that are used as a source or drain layer is proposed.

Figure 14:
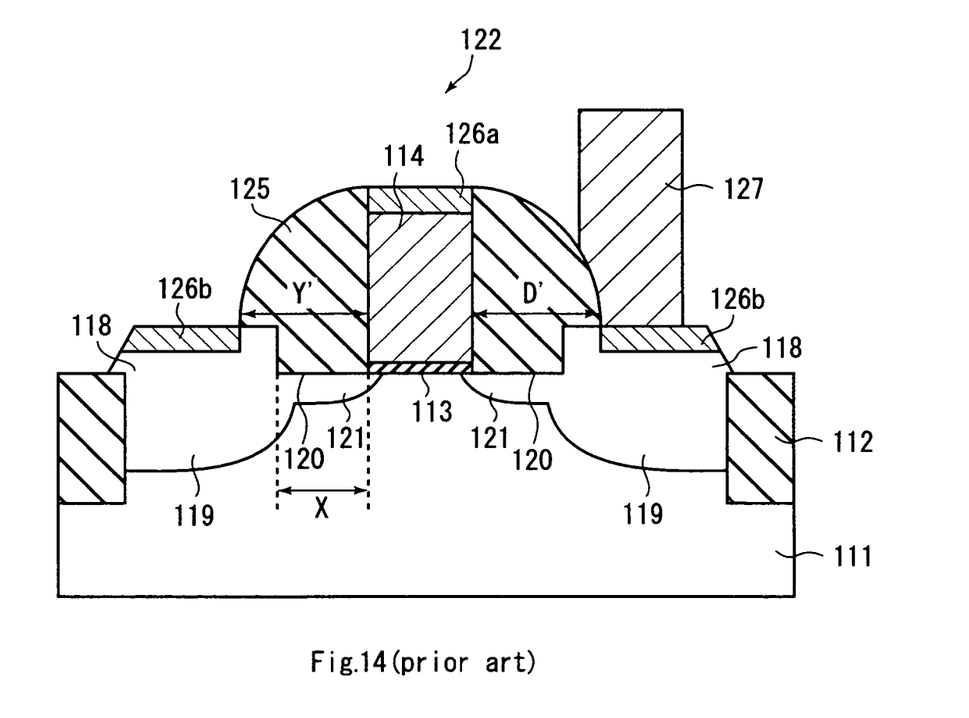
FIG. 14 shows a cross sectional view of a conventional semiconductor device having a side wall insulating film.

However, as shown in FIG. 14, a width Y of a side wall insulating film 125 may be wider than a width X' of a groove 120 due to a process dispersion, even though it is desirable that the width Y' of the side wall insulating film 125 is equal to the width X' of the groove 120 or shorter. In other words, the side wall insulating film 125 may extend on diffusion layers 119 that are used as a source or drain layer.

As a result, a performance of a MOS transistor 122 shown in FIG. 14 may be degraded because a space where a silicide layer 126b formed on the diffusion layer 119 is contact with a contact plug 127 is smaller. And also, a contact resistance may be greater because the space is smaller. In addition to that, this may cause the MOS transistor to unable to be downsized because a distance D (shown in FIG. 14) between a contact portion (bottom portion) of the contact plug 127 and a side surface of a gate electrode 114 is shorter. A semiconductor device having a side wall insulating film is also disclosed in Japanese Laid open kokai 2000-58816 and U.S. Pat. No. 6,624,034.

Figure 10:
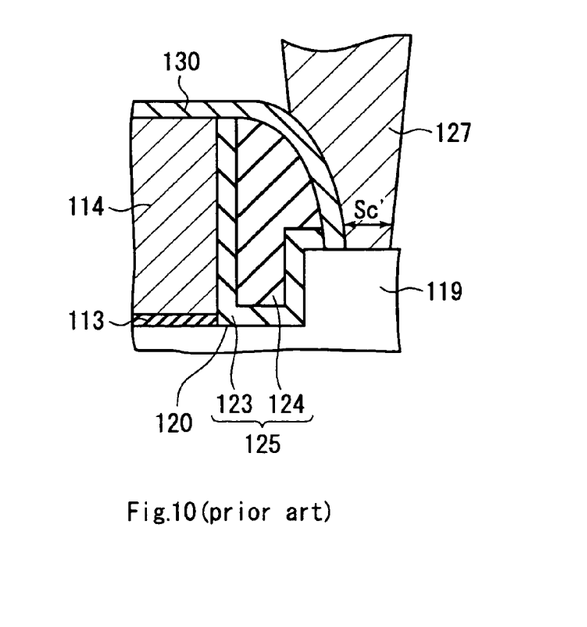
FIG. 10 shows a cross sectional view to depict a bottom portion of a contact plug formed in a conventional semiconductor device.

On the other hand, as shown in FIG. 10, a side wall insulating film 125 may be formed on a diffusion layer 119, and a bottom area Sc' of the contact plug 127 is decreased, thereby increasing a contact resistance between the diffusion layer 119 and the contact plug 127.

SUMMARY OF INVENTION

A first aspect of the present invention is providing a manufacturing method of a semiconductor device having a side wall insulating film, comprising; forming a gate insulating film on a semiconductor substrate, forming a gate electrode on the gate insulating film, forming a first side wall insulating film on a side surface of the gate electrode, forming a projecting portion on a first upper surface of the semiconductor substrate adjacent to the first side wall insulating film, forming a first diffusion layer by introducing impurities to the projecting portion formed on the semiconductor substrate, removing the first side wall insulating film so as to expose a second upper surface of the semiconductor substrate located below the first side wall insulating film, a width of the second upper surface exposed being a X, forming a second diffusion layer by introducing impurities to the second upper surface of the semiconductor substrate, and forming a second side wall insulating film on the side surface of the gate electrode and the second upper surface of the semiconductor substrate, a width of the second side wall insulating film being a Y, wherein the Y is 0.5X or more and the X or less ($0.5X \leq Y \leq X$).

A second aspect of the present invention is providing a semiconductor device having a side wall insulating film comprising; a semiconductor substrate, first and second projecting portions formed on the semiconductor substrate, a gate insulating film formed on the semiconductor substrate and between the first and second projecting portions, a gate electrode formed on the gate insulting film, a first diffusion layer that is formed in the first projecting portion and the semiconductor substrate, the first diffusion layer having a first portion that is formed in the semiconductor substrate, a second portion that is formed in the first projecting portion and formed on the first portion, and a third portion that is formed in the semiconductor substrate, connected to the first portion, and adjacent to the gate insulating film, a second diffusion layer that is formed in the second projecting portion and the semiconductor substrate, the second diffusion layer having a fourth portion that is formed in the semiconductor substrate, a fifth portion that is formed in the second projecting portion and formed on the third portion, and a sixth portion that is formed in the semiconductor substrate, connected to the fourth portion, and adjacent to the gate insulating film, first and second side wall insulating films formed on the third and six portions respectively, the first side wall insulating film located between the gate electrode and the second portion of the first diffusion layer, the second wall insulating film located between the gate electrode and the fifth portion of the second diffusion layer, each of the first and second side wall insulating films having a concave portion, and an interlayer insulating film formed so as to fulfill the concave portion and cover the gate electrode and the first and second side wall insulating films, wherein a distance between a bottom of the concave portion and a side surface of the gate electrode is 0.5X or more and X or less ($0.5X \leq Y \leq X$), the X being a distance between the side surface of the gate electrode and the second portion of the first diffusion layer, and the Y being the distance between the bottom of the concave portion and the side surface of the gate electrode.

A third aspect of the present invention is providing a semiconductor device having a side wall insulating film comprising; a gate insulating film formed on a semiconductor substrate, a gate electrode formed on the gate insulting film, a first diffusion layer that is formed in and on the semiconductor substrate, the first diffusion layer having a first portion that is formed in the semiconductor substrate, a second portion that is elevated from an upper surface of the semiconductor substrate and formed on the first portion, and a third portion that is formed in the semiconductor substrate, connected to the first portion, and adjacent to the gate insulating film, a second diffusion layer that is formed in and on the semiconductor substrate, the second diffusion layer having a fourth portion that is formed in the semiconductor substrate, a fifth portion that is elevated from the upper surface of the semiconductor substrate and formed on the third portion, and a sixth portion that is formed in the semiconductor substrate, connected to the fourth portion, and adjacent to the gate insulating film, first and second side wall insulating films formed above the semiconductor substrate, the first side wall insulating film located between the gate electrode and the second portion of the first diffusion layer, the second wall insulating film located between the gate electrode and the fifth portion of the second diffusion layer, each of the first and second side wall insulating films having a concave portion, and third and fourth side wall insulating films, the third side wall insulating film located between the gate electrode and the first side wall insulating film, the fourth side wall insulating films located between the gate electrode and the second side wall insulating film, wherein a distance between a bottom of the concave portion and a side surface of the gate electrode is 0.5 X or more and X or less ($0.5X \leq Y \leq X$), the X being a distance between the side surface of the gate electrode and the second portion of the first diffusion layer, and the Y being the distance between the bottom of the concave portion and the side surface of the gate electrode.

DETAILED DESCRIPTION OF THE INVENTION

We will explain embodiments of a present invention with reference to attached drawings. For explanation of a present invention, a same reference number will be assigned to a same portion over all drawings attached hereto.

FIRST EMBODIMENT

FIGS. 1 to 9 show cross sectional views of manufacturing steps of a semiconductor device having a side wall insulating film in a first embodiment of the present invention. Hereinafter, we will explain about the manufacturing steps relating to the first embodiment in the present invention with reference to drawings.

Figure 1:
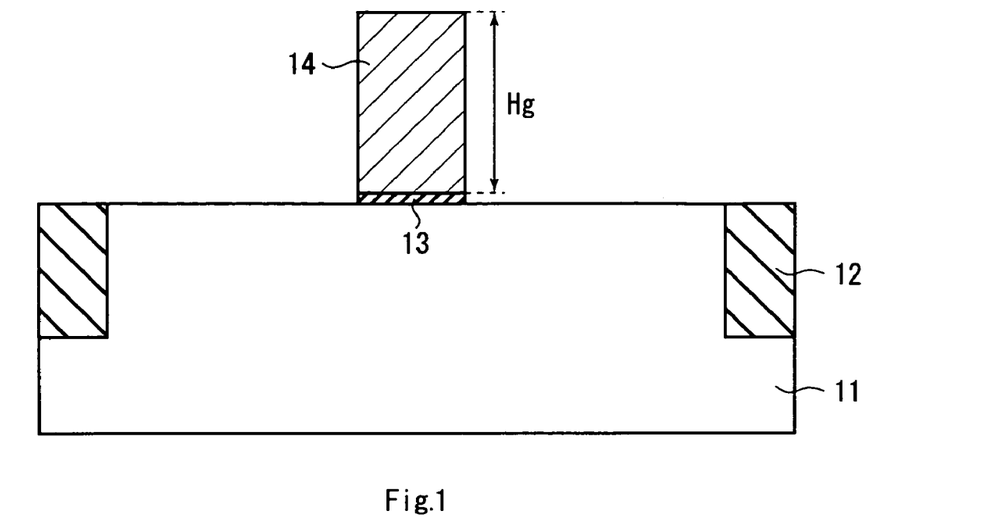
FIG. 1 shows a cross sectional view to depict a manufacturing step of a semiconductor device having a side wall insulating film of a first embodiment in the present invention.

FIG. 1 shows a cross sectional view to depict a manufacturing step of the semiconductor device having a side wall insulating film. As shown in FIG. 1, an element isolation region that comprises, for instance, a STI 12 (Shallow Trench Isolation) is formed in a semiconductor substrate 11. A channel region and a well are formed in the semiconductor substrate 11 (not shown). A gate insulating film 13 is formed on the semiconductor substrate 11. A gate electrode 14 is then formed on the gate insulating film 13. In case of 45 nm generation of a semiconductor transistor, a height Hg of the gate electrode 14 is, for instance, about 100 to 150 nm. However, as downsized after the 45 nm generation, the height Hg is expected to shrink with 70 to 80 percent of the height of the 45 nm generation.

Figure 2:
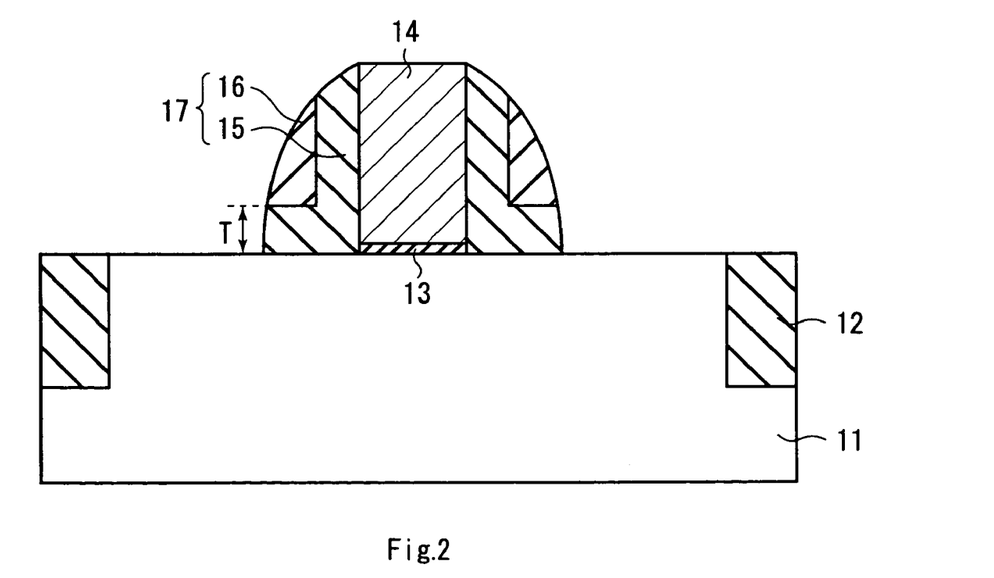
FIG. 2 shows a cross sectional view to depict a manufacturing step of a semiconductor device having a side wall insulating film of a first embodiment in the present invention after the manufacturing step shown in FIG. 1.

As shown in FIG. 2, first and second insulating films 15 and 16 are formed in order on the semiconductor substrate 11, the gate insulating film 13, and the gate electrode 14. After that, predetermined portions of the first and second insulating films 15 and 16 are selectively removed, thereby forming a side wall 17 on side surfaces of the gate insulating film 13 and the gate electrode 14. Materials of the first and second insulating films 15 and 16 may be same or different.

In case where the materials of the first and second insulating films 15 and 16 are different, one of the first and second insulating films 15 and 16 may be a layer containing Nitrogen, for instance, a SiN layer (Silicon Nitride layer). On the other hand, the other of the first and second insulating films 15 and 16 may be a silicon oxide layer, for instance, a TEOS (Tetra Ethyl Ortho Silicate) layer or a BPSG (Boron Silicon Glass) layer.

It is, but not limited to, desirable that the first insulating film 15 under the second insulating film 16 is the silicon nitride layer. Because when an epitaxial layer 18, as will be shown below, is formed by an epitaxial growth technique, the silicon nitride layer can prevent from forming a facet on a side surface F1 of the gate electrode 14. Furthermore, in order to prevent from forming the facet of the side surface of the gate electrode 14, it is, but is not limited to, desirable that a thickness of the first insulating film 15 T is thicker than the height H of the epitaxial layer 18 (not shown in FIG. 1 yet). For example, the first insulating film 15 with 30 nm or more in thickness may be formed. It should be noted that the height of the first insulating film 15 means a thickness at a moment the first insulating film 15 was formed.

And also, as stated above, the side wall insulating film 17 is comprised of the first and second insulating layers 15 and 16 (two insulating layers). However, the side wall insulating film 17 may be comprised of a singular layer. In this case, it is desirable that the side wall insulating film 17 is a silicon nitride layer in order to prevent from forming the facet of the side surface of the gate electrode 14.

Figure 3:
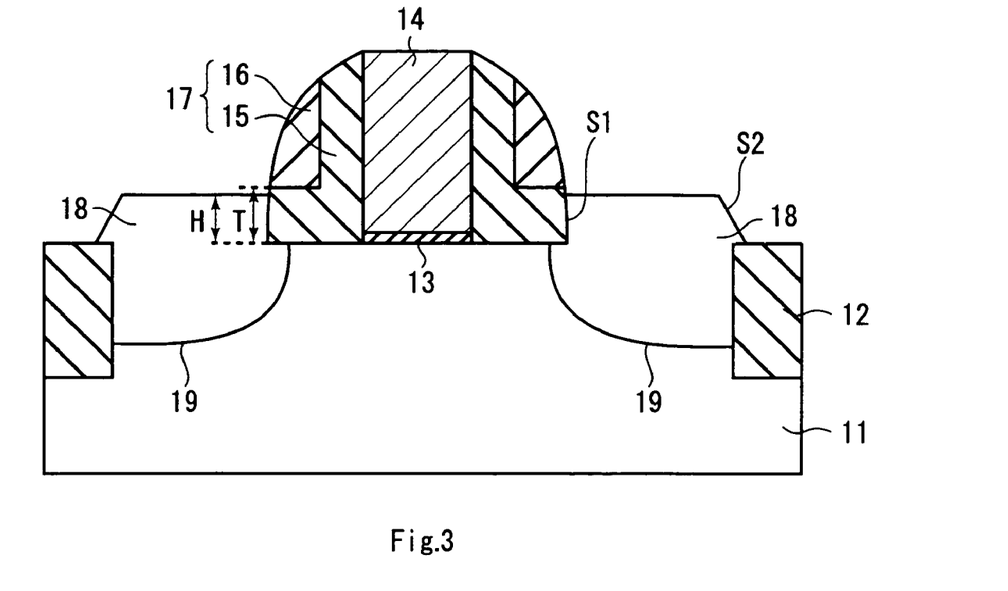
FIG. 3 shows a cross sectional view to depict a manufacturing step of a semiconductor device having a side wall insulating film of a first embodiment in the present invention after the manufacturing step shown in FIG. 2.

As shown in FIG. 3, upper surfaces of the silicon substrate 11 adjacent to the side wall insulating layer 17 are selectively grown by using the epitaxial growth technique, thereby forming epitaxial layers 18 that are elevated from the upper surfaces of the semiconductor substrate 11. After that, impurities are injected to upper surfaces of the epitaxial layers 18 and then heat is added (annealing), thereby forming diffusion layers 19. It is, as stated above, desirable that the thickness H of the epitaxial layer 18 is thinner than the thickness T of the first insulating film 15. For example, the thickness H of the epitaxial layer 18 is 30 nm. It should be noted that the thickness H of the epitaxial layer 18 is, as shown in FIG. 3, defined as a distance between an upper surface of the silicon substrate and an upper surface of the epitaxial layer 18.

The epitaxial layer 18 includes a first surface S1 that is in contact with the side wall insulating film 17 and a second surface S2 that is located at an opposite side of the first surface S1. As shown in FIG. 3, the second surface S2 is a surface that leans toward the gate electrode 14 (a facet). It should be noted that the second surface S2 may not be existed, or may be formed not to be located on the element isolation layer 12.

Figure 4:
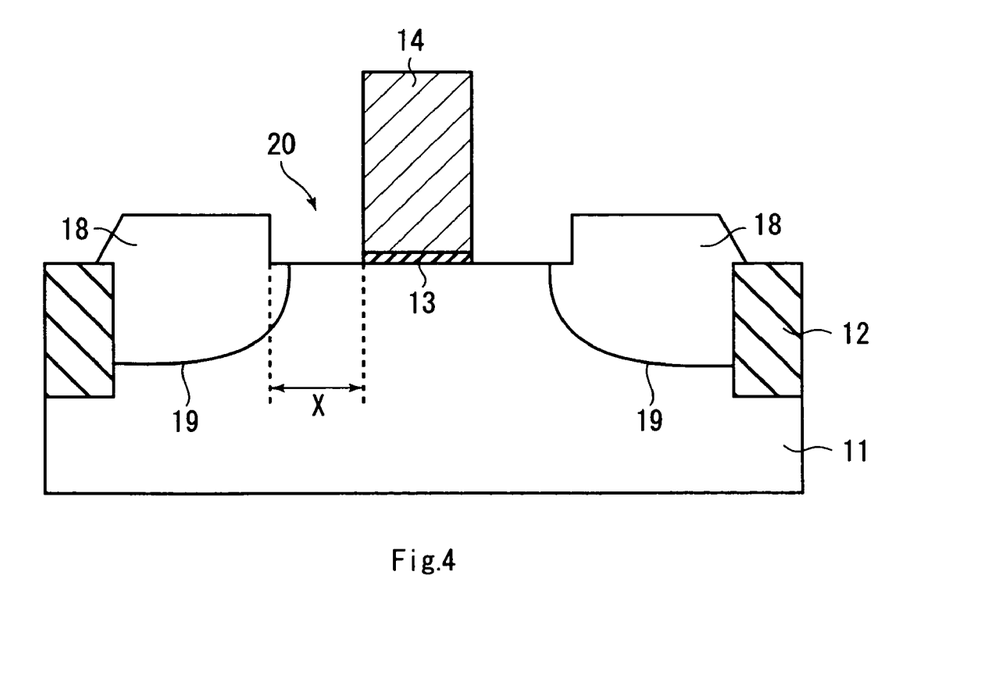
FIG. 4 shows a cross sectional view to depict a manufacturing step of a semiconductor device having a side wall insulating film of a first embodiment in the present invention after the manufacturing step shown in FIG. 3.

As shown in FIG. 4, the side wall insulating layer 17 is removed by using an isotropic etching method, for example, a wet etching method or a CDE (Chemical Dry Etching) method. Thereby, upper surfaces of the semiconductor substrate 11 are exposed, and a groove 20 with, for example, about 35 to 40 nm in width in case of a 45 nm generation is formed between the gate electrode 14 and the epitaxial layer 18 of the diffusion layer 19.

Figure 5:
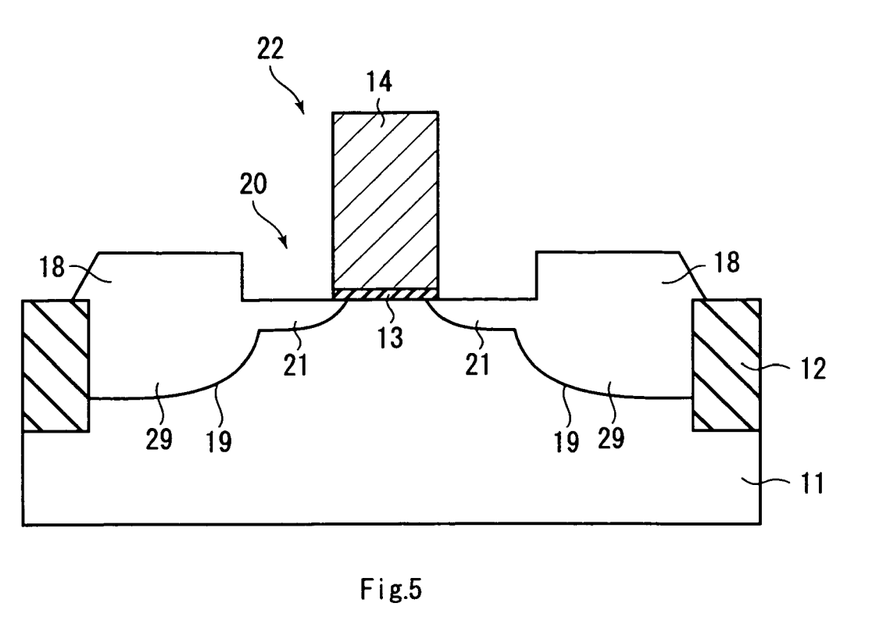
FIG. 5 shows a cross sectional view to depict a manufacturing step of a semiconductor device having a side wall insulating film of a first embodiment in the present invention after the manufacturing step shown in FIG. 4.

As shown in FIG. 5, extension layers 21 are formed in a bottom portion of the groove 20 by using an ion implantation technique and an annealing technique. And also, each of the diffusion layers 19 includes a first portion 29 that is formed in the semiconductor substrate 11, a second portion (the epitaxial layer 18) that is elevated from an upper surface of the semiconductor substrate 11 and formed on the first portion 29, and a third portion (the extension layer 21) that is formed in the semiconductor substrate 11, connected to the first portion 29, and adjacent to the gate insulating film 13.

Figure 6:
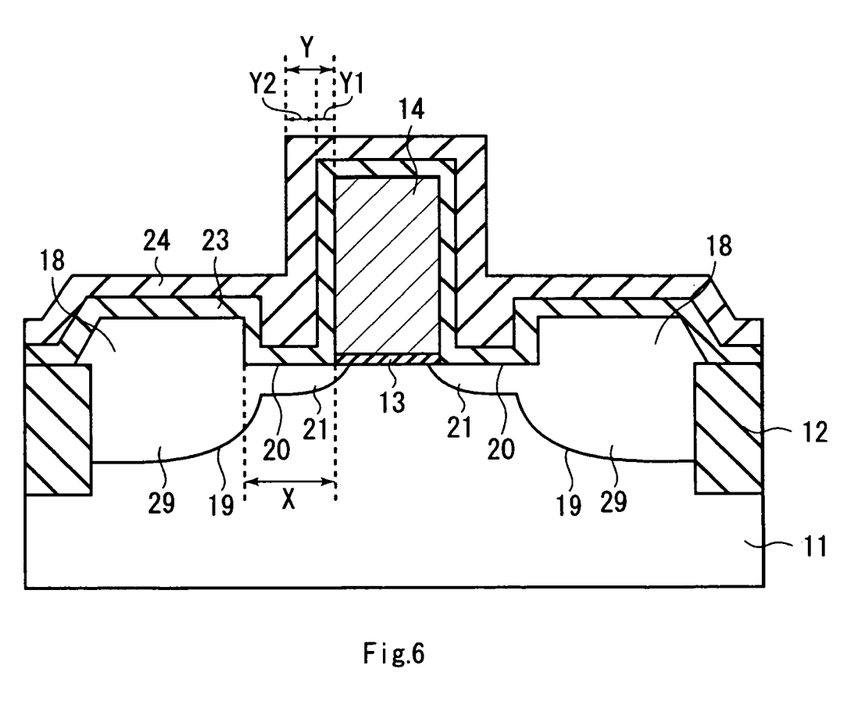
FIG. 6 shows a cross sectional view to depict a manufacturing step of a semiconductor device having a side wall insulating film of a first embodiment in the present invention after the manufacturing step shown in FIG. 5.

As shown in FIG. 6, a third insulating film 23 is formed on the gate electrode 14 and the semiconductor substrate 11. With fourth insulating film 24 is then formed on the third insulating film 23. At the 45 nm generation, the width Y1 of the third insulating film 23 is about 15 nm, the width Y2 of the fourth insulating film 24 is about 25 nm.

It is desirable that a material of the third insulting film 23 is different from that of the fourth insulating film 24 in order to keep a different etching rate between the third insulating film 23 and the fourth insulating film 24. For example, the third insulating film 23 may be made of one of a silicon oxide film, a TEOS film, and a BSG film, and the fourth insulating film 24 may be made of a silicon film containing nitrogen, for instance, a silicon nitride film. And also, inversely, the third insulating film 23 may be made of a silicon film containing nitrogen, for instance, a silicon nitride film, and the fourth insulating film 24 may be made of one of a silicon oxide film, a TEOS film, and a BSG film.

Figure 7:
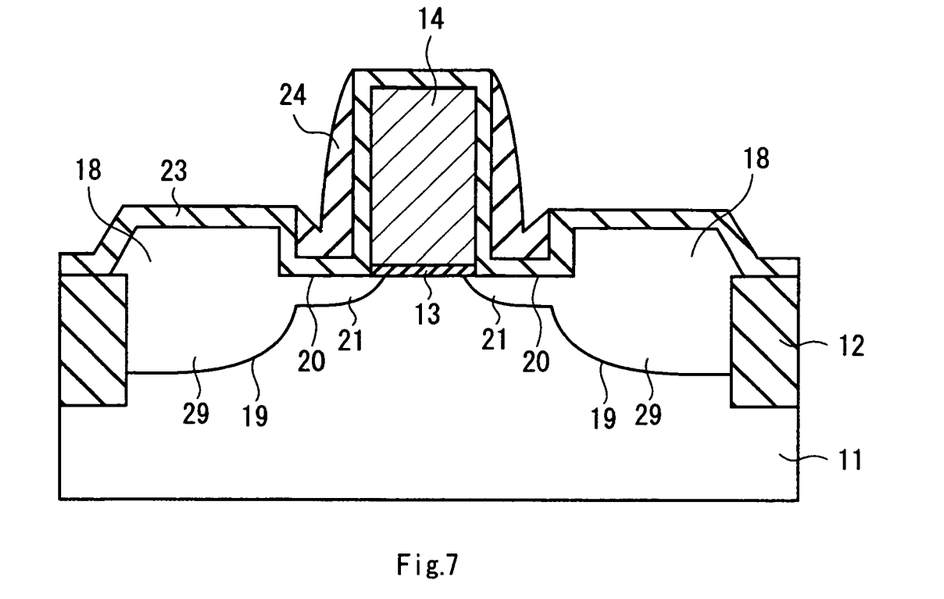
FIG. 7 shows a cross sectional view to depict a manufacturing step of a semiconductor device having a side wall insulating film of a first embodiment in the present invention after the manufacturing step shown in FIG. 6.

As shown in FIG. 7, portions of the fourth insulating film 24 are removed by using the third insulating film 23 as a mask, and using a non-isotropic etching technique, for instance, a RIE (Reactive Ion Etching) technique.

Figure 8:
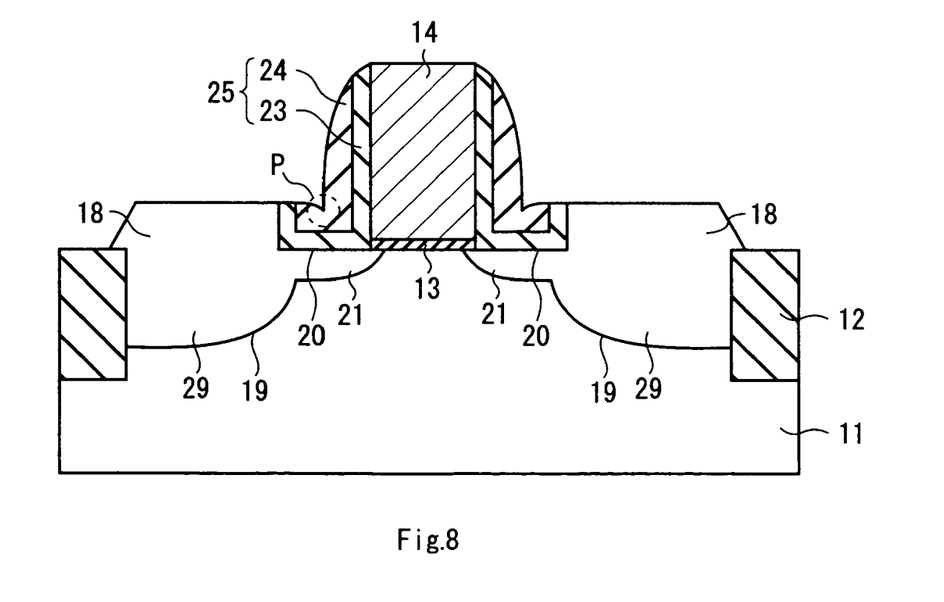
FIG. 8 shows a cross sectional view to depict a manufacturing step of a semiconductor device having a side wall insulating film of a first embodiment in the present invention after the manufacturing step shown in FIG. 7.

As shown in FIG. 8, portions of the third insulating film 23 are removed by using a non-isotropic etching technique, for instance, a RIE technique, thereby forming a side wall insulating film 25 that is comprised of the third and fourth insulating films 23 and 24 on side surfaces of the gate electrode 14, and resulting in forming a concave portion P in the fourth insulating film 24. As shown in FIG. 8, the concave portion P is located in the groove 20 and below an upper surface of the second portion of the diffusion layer 19 (the epitaxial layer 18).

It is also desirable that the width Y1 of the third insulating film 23 is thinner than the width Y2 of the fourth insulating film 24 in order to make a concave portion P as small as possible, and to prevent the third insulating film 23 from being over-etched at a step of the removing thereof. The concave portion P is going to be formed at a wet etching step that is performed before a step of forming siliside layers 26a and 26b As stated above, the side wall insulating film 25 is comprised of two films (the third and fourth insulating films 23 and 24). However, it is not limited to that. For example, the side wall insulating film 25 may be comprised of a singular film or multiple films more than two layers. In case of the singular film, it is desirable that a material of the singular film is a silicon oxide film in order to prevent an upper surface of the silicon substrate 11 from being removed at a step of etching the singular film.

Figure 9:
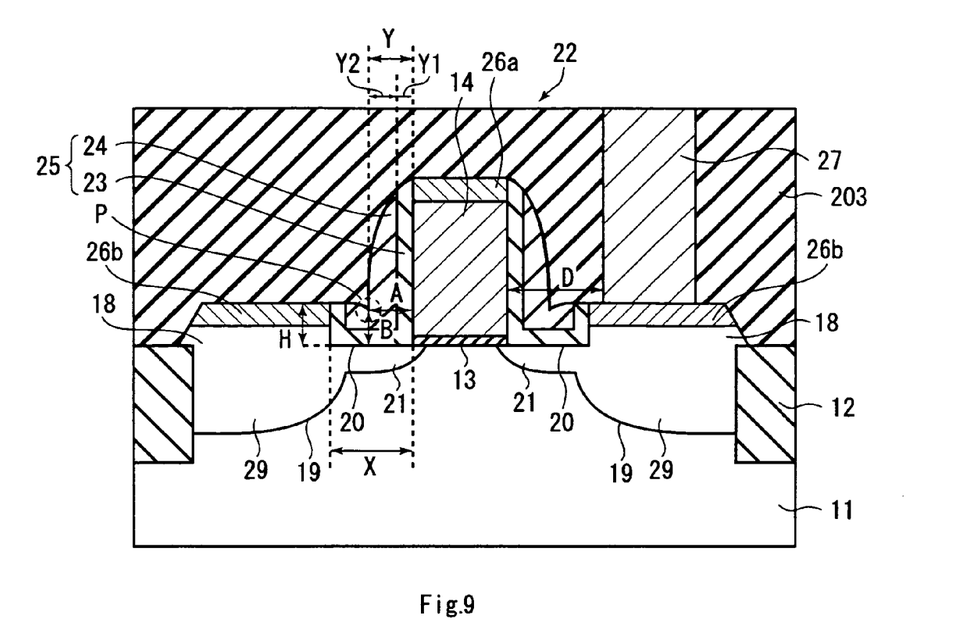
FIG. 9 shows a cross sectional view to depict a manufacturing step of a semiconductor device having a side wall insulating film of a first embodiment in the present invention after the manufacturing step shown in FIG. 8.

As shown in FIG. 9, an etching damage removing step, for instance, a wet etching step is performed, thereby avoiding the etching damage that happened to be introduced in the second portion of the diffusion layer 19 (the epitaxial layer 18) when the portions of the third insulating film 23 were removed by the non-isotropic etching technique. After that, silicide layers 26a and 26b are formed on upper surfaces of the gate electrode 14 and the second portion of the diffusion layer 19 (the epitaxial layer 18), respectively. An interlayer insulating film 203 is then formed above the gate electrode 14 and the side wall insulating film 25 so as to fulfill the concave portions P. And then, a contact plug 27 is formed so as to reach the silicide layer 26b, thereby being electrically connected to the diffusion layer 19.

It should be noted that there is a relationship of $0.5X \leq Y \leq X$ (Y is 0.5X or more and X or less). As shown in FIG. 6, the X means a width of the groove 20 (a total width of the first insulating film 15 and the second insulating film 16). The Y means a total width of the side wall insulating film (a total width of the third insulating film 23 and the fourth insulating film 24) at a moment of forming the third and fourth insulating films 15 and 16.

And also, it should be noted that as to a location of the concave portion P, there is relationships of $0.5X \leq A \leq X$ (A is 0.5X or more and X or less) and $B<H$ (B is less than H). As shown in FIG. 9, the A means a horizontal location of the concave portion P from the side surface of the gate electrode 14, the B means a vertical location of the concave portion P from the upper surface of the groove 20, and the H means a height of the second portion 18 of the diffusion layer 19 from the upper surface of the groove 20.

If the width Y of the side wall insulating film 25 is greater than the width X of the groove 20, that is, $Y>X$, the side wall insulating film 25 may be remain on the second portion 18 of the diffusion layer 19 even after the steps of removing shown in FIGS. 6 and 7. On the other hand, if a half of the width X of the groove 20 is greater than the width Y of the side wall insulating film 25, that is, 0.5X>Y, parts of the upper surface of the third portion 21 of the diffusion layer 19 may be exposed, thereby being over-etched at the steps of the removing shown in FIGS. 6 and 7. Therefore, the width X of the groove 20 and the width Y of the side wall insulating film 25 should have the relationship of $0.5X \leq Y \leq X$ (Y is 0.5X or more and X or less).

It is also desirable that the width Y of the side wall insulating film 25 is 0.75X (=the center point between 0.5X and X). However, we need to consider the error of 10% in thickness ($0.75X - 0.1 \times 0.75X$ to $0.75X + 0.1 \times 0.75X = 0.675X$ to $0.825X$) when the side wall insulating film 25 is formed. Therefore, it is desirable that the width X of the groove 20 and the width Y of the side wall insulating film 25 may have a relationship of $0.675X \leq Y \leq 0.825X$ (0.675X or more and 0.825X or less).

It is also noted that the location A of the concave portion P (shown in FIG. 9) is located in the range of $0.5X \leq A \leq X$, but may be located in the range of $0.675X \leq A \leq 0.825X$.

According to the first embodiment of the present invention, the width X of the groove 20 is formed by removing the side wall insulating film 17. And also, the width Y of the side wall insulating film 25 is adjusted to comply with the relationship of $0.5X \leq Y \leq X$ (Y is 0.5X or more and X or less), thereby forming in self-align the side wall insulating film 25 within the groove 20, preventing the side wall insulating film 25 from being formed on the second portion 18 of the diffusion layer 19, and preventing the upper surface of the third portion 21 of the diffusion layer 19 from being removed. As a result, an area of the silicide layer 26b formed on the diffusion layer 19 is prevented from being smaller, thereby preventing a performance of the transistor from being degraded. And also, a contact area where the contact plug 27 and the silicide layer 26b are contact with each other is preventing from being smaller, thereby preventing a contact resistance between the contact plug 27 and the silicide layer 26b from increasing. Furthermore, a distance D between the contact plug 27 and the gate electrode 14 can be shorter, thereby being able to downsize the transistor.

SECOND EMBODIMENT

Figure 11:
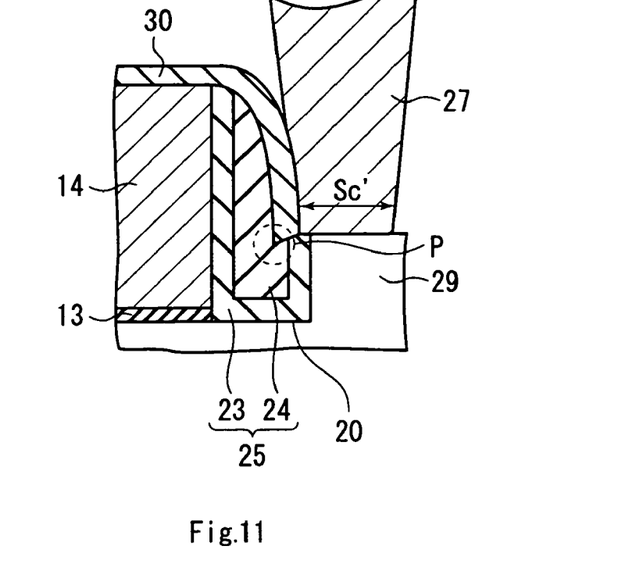
FIG. 11 shows a cross sectional view to depict a bottom portion of a contact plug formed in a semiconductor device having a side wall insulating film of a second embodiment in the present invention.

We will explain a second embodiment of the present invention with reference to a drawing. As shown in FIG. 11, the side wall insulating film 25 is not formed on the diffusion layer 19 and the concave portion P is formed within the groove 20, thereby preventing an bottom area of the contact plug 27 from decreasing, and preventing the contact resistance between the contact plug 27 and the diffusion layer 29 from increasing even in case where an insulating film 30 is formed so as to cover the gate electrode 14.

THIRD EMBODIMENT

Figure 12:
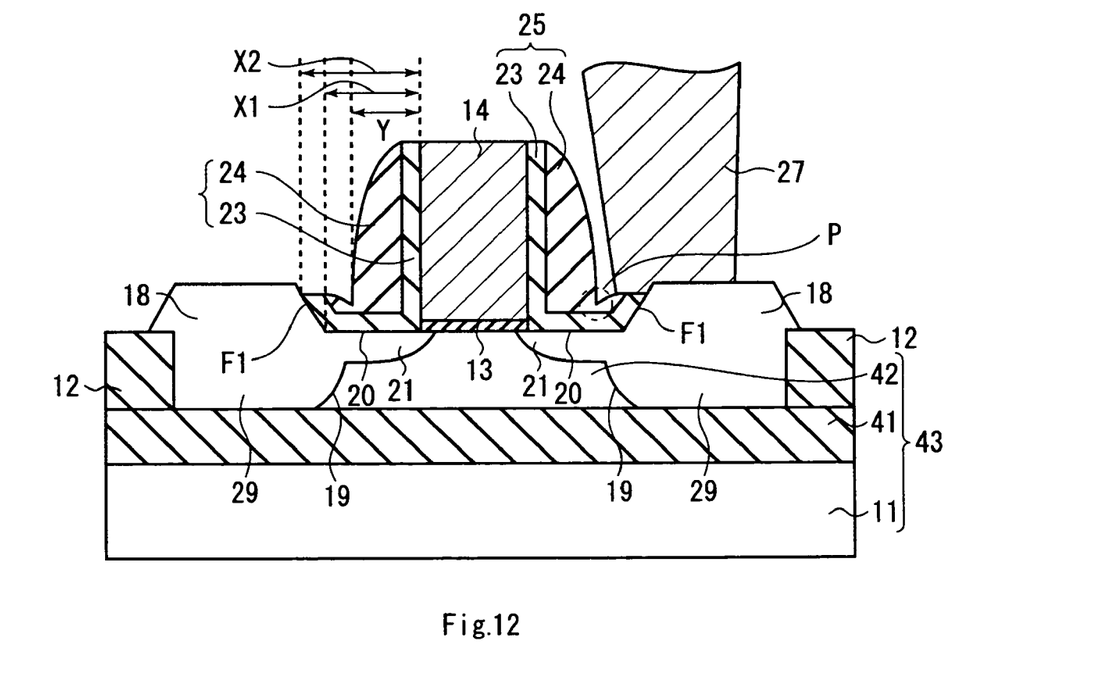
FIG. 12 shows a cross sectional view of a semiconductor device having a side wall insulating film of a third embodiment in the present invention.

We will explain a third embodiment of the present invention with reference to drawings. As shown in FIG. 12, a buried insulating layer 41 is formed on a semiconductor substrate 11. A SIO layer 42 is formed on the buried insulating layer 41 and located between element insulating layers 12. A gate electrode 14 is formed on the gate insulating film 13 that is formed on the SIO layer 42. A side wall insulating film 25 (collectively, insulating films 23 and 24) with Y in width is formed on side surfaces of the gate electrode 14 and located between a diffusion layer 19 and the gate electrode 14. As shown in FIG. 12, the side wall insulating layer 25 has a concave portion P. The diffusion layer 19 has a first portion 29, a second portion 18 that is elevated from the first portion 29, and a third portion 21 that is adjacent to the gate electrode 14. And also, a contact plug 27 is electrically connected to the second portion 18 of the diffusion layer 19. As stated in the first embodiment of the present invention, a siliside layer may be formed on the gate electrode 14 and/or the second portion 18 of the diffusion layer 19.

In the third embodiment of the present invention, a width X2 of an upper portion of a groove 20 is greater than a width X1 of a lower portion of the groove 20. In this case, the width X2 of the upper portion of the groove 20 and the width Y of the side wall insulating film 25 formed on the side surface of the gate electrode 14 have a relationship of $X2/2$ (X2 divided by 2)$\leq Y \leq X2$, and may have a relationship of $0.675X2$ (X2 multiplied by 0.675)$\leq Y \leq 0.825X2$ (X2 multiplied by 0.825) from the same reason stated in the first embodiment of the present invention.

As stated in the first embodiment of the present invention, it is also noted that the location A of the concave portion P (shown in FIG. 12) is located in the range of $X2/2$ (X2 divided by 2)$\leq A \leq X$, but may be located in the range of $0.675X2$ (X2 multiplied by 0.675)$\leq A \leq 0.825X2$ (X2 multiplied by 0.825) from the same reason stated in the first embodiment of the present invention.

Figure 13:
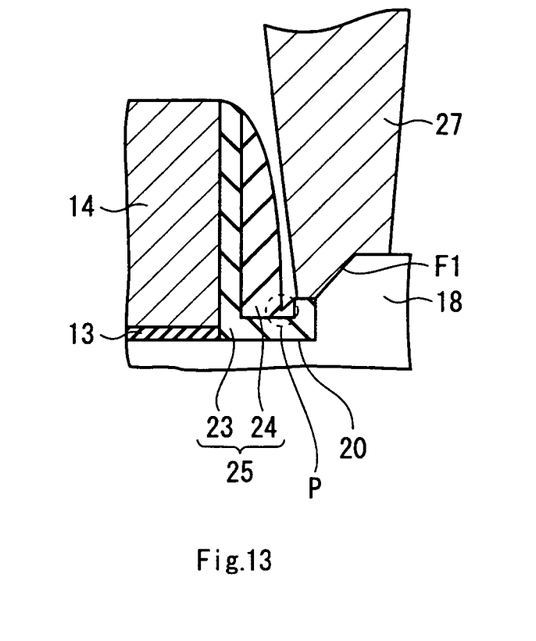
FIG. 13 shows a cross sectional view to depict a bottom portion of a contact plug formed in a semiconductor device having a side wall insulating film of the third embodiment in the present invention.

According to the third embodiment of the present invention, as stated in the first embodiment, the semiconductor device of the third embodiment has the same effect as that of the first embodiment in the present invention. In addition to that, as shown in FIG. 13 (a cross sectional view of a bottom portion of a contact plug 27), a contact face between the contact plug 27 and the second portion 18 of the diffusion layer 19 has the facet (slope), thereby resulting in making an area of the contact face larger and making a contact resistance at the contact face smaller.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended and their equivalents.

What is claimed is:

1. A semiconductor device having a side wall insulating film comprising:

a semiconductor substrate, first and second projecting portions formed on the semiconductor substrate, a gate insulating film formed on the semiconductor substrate and between the first and second projecting portions, a gate electrode formed on the gate insulting film, a first diffusion layer that is formed in the first projecting portion and the semiconductor substrate, the first diffusion layer having a first portion that is formed in the semiconductor substrate, a second portion that is formed in the first projecting portion and formed on the first portion, and a third portion that is formed in the semiconductor substrate, connected to the first portion, and adjacent to the gate insulating film, a second diffusion layer that is formed in the second projecting portion and the semiconductor substrate, the second diffusion layer having a fourth portion that is formed in the semiconductor substrate, a fifth portion that is formed in the second projecting portion and formed on the fourth portion, and a sixth portion that is formed in the semiconductor substrate, connected to the fourth portion, and adjacent to the gate insulating film, first and second side wall insulating films formed on the third and six portions respectively, the first side wall insulating film located between the gate electrode and the second portion of the first diffusion layer, the second wall insulating film located between the gate electrode and the fifth portion of the second diffusion layer, each of the first and second side wall insulating films having a concave portion, and an interlayer insulating film formed so as to fulfill the concave portion and cover the gate electrode and the first and second side wall insulating films, wherein a distance between a bottom of the concave portion and a side surface of the gate electrode is 0.5X or more and X or less (0.5X≦Y≦X), the X being a distance between the side surface of the gate electrode and the second portion of the first diffusion layer, and the Y being the distance between the bottom of the concave portion and the side surface of the gate electrode.

2. The semiconductor device having a side wall insulating film according to claim 1, further comprising a first silicide layer formed on an upper surface of the second portion of the first diffusion layer, a second silicide laginal) The semiconductor device having a side wall insulating film according to claim 1, further comprising a third silicide layer formed on an upper surface of the gate electrode.

3. The semiconductor device having a side wall insulating film according to claim 1, further comprising a third silicide layer formed on an upper surface of the gate electrode.

4. The semiconductor device having a side wall insulating film according to claim 1, further comprising a contact plug configured to be electrically connected to the first diffusion layer.

5. The semiconductor device having a side wall insulating film according to claim 4, wherein the contact plug is in contact with the first side wall insulating film.

6. The semiconductor device having a side wall insulating film according to claim 1, wherein the distance between a bottom of the concave portion and the side surface of the gate electrode is 0.675X or more and 0.825X or less (0.675X≦Y≦0.825X).

7. The semiconductor device having a side wall insulating film according to claim 1, both of the first and second side wall insulating films are a silicon nitride layer.

8. A semiconductor device having a side wall insulating film comprising:

a gate insulating film formed on a semiconductor substrate, a gate electrode formed on the gate insulting film, a first diffusion layer that is formed in and on the semiconductor substrate, the first diffusion layer having a first portion that is formed in the semiconductor substrate, a second portion that is elevated from an upper surface of the semiconductor substrate and formed on the first portion, and a third portion that is formed in the semiconductor substrate, connected to the first portion, and adjacent to the gate insulating film, a second diffusion layer that is formed in and on the semiconductor substrate, the second diffusion layer having a fourth portion that is formed in the semiconductor substrate, a fifth portion that is elevated from the upper surface of the semiconductor substrate and formed on the fourth portion, and a sixth portion that is formed in the semiconductor substrate, connected to the fourth portion, and adjacent to the gate insulating film, first and second side wall insulating films formed above the semiconductor substrate, the first side wall insulating film located between the gate electrode and the second portion of the first diffusion layer, the second wall insulating film located between the gate electrode and the fifth portion of the second diffusion layer, each of the first and second side wall insulating films having a concave portion, and third and fourth side wall insulating films, the third side wall insulating film located between the gate electrode and the first side wall insulating film, the fourth side wall insulating films located between the gate electrode and the second side wall insulating film, wherein a distance between a bottom of the concave portion and a side surface of the gate electrode is 0.5 X or more and X or less (0.5X≦Y≦X), the X being a distance between the side surface of the gate electrode and the second portion of the first diffusion layer, and the Y being the distance between the bottom of the concave portion and the side surface of the gate electrode.

9. The semiconductor device having a side wall insulating film according to claim 8, further comprising a first suicide layer formed on an upper surface of the second portion of the first diffusion layer, a second silicide layer formed an upper surface of the fifth portion of the second diffusion layer.

10. The semiconductor device having a side wall insulating film according to claim 8, further comprising a third silicide layer formed on an upper surface of the gate electrode.

11. The semiconductor device having a side wall insulating film according to claim 8, further comprising a contact plug configured to be electrically connected to the first diffusion layer.

12. The semiconductor device having a side wall insulating film according to claim 11, wherein the contact plug is contact with the first side wall insulating film.

13. The semiconductor device having a side wall insulating film according to claim 8, wherein the distance between the bottom of the concave portion and the side surface of the gate electrode is 0.675X or more and 0.825X or less (0.675X≦Y≦0.825X).

14. The semiconductor device having a side wall insulating film according to claim 8, both of the first and second side wall insulating films are a silicon nitride layer.

* * * * *